(12) United States Patent
Halder

(10) Patent No.: US 6,769,090 B1
(45) Date of Patent: Jul. 27, 2004

(54) UNIFIED TECHNIQUE FOR MULTI-RATE TRELLIS CODING AND DECODING

(75) Inventor: Bijit Halder, Mountain View, CA (US)

(73) Assignee: Virata Corporation, Raleigh, NC (US)

( * ) Notice: Subject to any disclaimer, the term of this patent is extended or adjusted under 35 U.S.C. 154(b) by 576 days.

(21) Appl. No.: 09/639,714

(22) Filed: Aug. 14, 2000

(51) Int. Cl.[7] .................... H03M 13/25; H03M 13/41
(52) U.S. Cl. ................................ 714/792; 714/795
(58) Field of Search .................. 714/795, 796, 714/792

(56) References Cited

U.S. PATENT DOCUMENTS

| | | | | |
|---|---|---|---|---|
| 4,493,082 A | * | 1/1985 | Cumberton et al. | 714/792 |
| 4,606,027 A | | 8/1986 | Otani | 371/43 |
| 5,220,570 A | | 6/1993 | Lou et al. | 371/43 |
| 5,457,705 A | | 10/1995 | Todoroki | 371/43 |
| 5,502,736 A | * | 3/1996 | Todoroki | 714/795 |
| 5,509,021 A | * | 4/1996 | Todoroki | 714/795 |
| 5,651,032 A | * | 7/1997 | Okita | 375/341 |
| 5,737,365 A | * | 4/1998 | Gilbert et al. | 375/224 |
| 5,751,734 A | | 5/1998 | Choi et al. | 371/43.4 |
| 5,796,756 A | | 8/1998 | Choi et al. | 371/43.7 |
| 5,838,729 A | | 11/1998 | Hu et al. | 375/265 |
| 5,928,378 A | | 7/1999 | Choi | 714/795 |
| 5,946,361 A | | 8/1999 | Araki et al. | 375/341 |
| 5,970,104 A | | 10/1999 | Zhong et al. | 375/341 |
| 5,995,562 A | | 11/1999 | Koizumi | 375/342 |
| 6,233,712 B1 | * | 5/2001 | Rhee et al. | 714/789 |
| 6,269,129 B1 | * | 7/2001 | Rhee et al. | 375/341 |
| 6,353,640 B1 | * | 3/2002 | Hessel et al. | 375/262 |
| 6,370,202 B1 | * | 4/2002 | Wolcott | 375/295 |

OTHER PUBLICATIONS

Falconer, David D. and Ljung, Lennart, "Application of Fast Kalman Estimation to Adaptive Equalization," IEEE Trans. on Comm., COM–26, No. 10 (Oct. 1978).
Gitlin, Richard D; Hayes, Jeremiah F.; and Weinstein, Stephen B., "Data Communications Principles," Chapter 8, p. 591 (1992).
J. Quilichi, "HDSL2 drives down the deployment cost for T1 service", pp. 1–7.
M. Rude, "Draft for HDSL2 Standard", pp. 1–15.
M. Tu, "A 512–State PAM TCM Code for HDSL2", pp. 1–7.
P. Jackson, "Literature Survey on HDSL2 Modem Modeling and Simulation", pp. 1–10.
J. Quilichi, "An HDSL2 Primer", pp. 1–18.
G. A. Zimmerman, "HDSL2 Tutorial: Spectral Compatibility and Real–World Performance Advances", pp. 1–12.

* cited by examiner

Primary Examiner—Stephen M. Baker
(74) Attorney, Agent, or Firm—Burns, Doane, Swecker & Mathis, LLP

(57) ABSTRACT

The present invention, generally speaking, provides efficient multi-rate trellis encoder and decoder structures. The trellis encoder allows for a variable number of uncoded bits to be represented in a transmit symbol. The decoder maps received symbols to a smaller constellation by dropping selected symbol bits, whereby, for each of multiple cosets, points within that coset are mapped to a fewer number of points. Substantial simplification of the decoder structure is therefore achieved.

26 Claims, 13 Drawing Sheets

| ENCODER OUTPUT $Y_3Y_2Y_1Y_0$ | NUMERICAL VALUE | 12-BIT CONSTELLATION | ENCODER OUTPUT $Y_3Y_2Y_1Y_0$ | NUMERICAL VALUE | 12-BIT CONSTELLATION |
|---|---|---|---|---|---|
| 0000 | -15/16 | 100010000000 | 1100 | 1/16 | 000010000000 |
| 0001 | -13/16 | 100110000000 | 1101 | 3/16 | 000110000000 |
| 0010 | -11/16 | 101010000000 | 1110 | 5/16 | 001010000000 |
| 0011 | -9/16 | 101110000000 | 1111 | 7/16 | 001110000000 |
| 0100 | -7/16 | 110010000000 | 1000 | 9/16 | 010010000000 |
| 0101 | -5/16 | 110110000000 | 1001 | 11/16 | 010110000000 |
| 0110 | -3/16 | 111010000000 | 1010 | 16/16 | 011010000000 |
| 0111 | -1/16 | 111110000000 | 1011 | 15/16 | 011110000000 |

FIG. 12 PRIOR ART
State transition
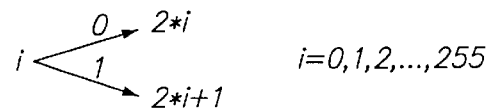
$i=0,1,2,...,255$
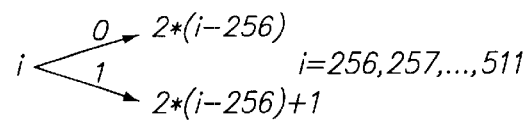
$i=256,257,...,511$
$i$ and $i+256$ enters the same states, $i \leq 255$ but with different outputs
FIG. 13
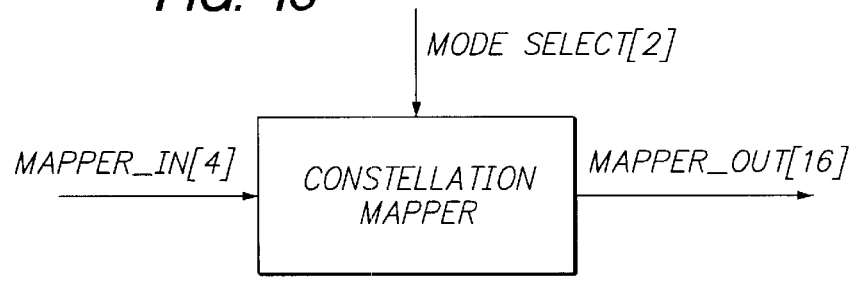
FIG. 14
| -15 | -13 | -11 | -9 | -7 | -5 | -3 | -1 | 1 | 3 | 5 | 7 | 9 | 11 | 13 | 15 | |
|---|---|---|---|---|---|---|---|---|---|---|---|---|---|---|---|---|
| 0 | 1 | 0 | 1 | 0 | 1 | 0 | 1 | 0 | 1 | 0 | 1 | 0 | 1 | 0 | 1 | $Y_0$ |
| 0 | 0 | 1 | 1 | 0 | 0 | 1 | 1 | 0 | 0 | 1 | 1 | 0 | 0 | 1 | 1 | $Y_1$ |
| 0 | 0 | 0 | 0 | 1 | 1 | 1 | 1 | 1 | 1 | 1 | 1 | 0 | 0 | 0 | 0 | $Y_2$ |
| 0 | 0 | 0 | 0 | 0 | 0 | 0 | 0 | 1 | 1 | 1 | 1 | 1 | 1 | 1 | 1 | $Y_3$ |

8 PAM

| MAPPER_IN[3:0] | OUT | OUTPUT (HEX) |
|---|---|---|
| 000X | -7/8 | 9000 |
| 001X | -5/8 | B000 |
| 010X | -3/8 | D000 |
| 011X | -1/8 | F000 |
| 100X | 1/8 | 1000 |
| 101X | 3/8 | 3000 |
| 110X | 5/8 | 5000 |
| 111X | 7/8 | 7000 |

4 PAM

| MAPPER_IN[3:0] | OUT | OUTPUT (HEX) |
|---|---|---|
| 11XX | -3/4 | A000 |
| 10XX | -1/4 | E000 |
| 00XX | 1/4 | 2000 |
| 01XX | 3/4 | 6000 |

2 PAM

| MAPPER_IN[3:0] | OUT | OUTPUT (HEX) |
|---|---|---|
| 0XXX | -9/16 | B800 |
| 1XXX | +9/16 | 4800 |

CALCULATE DISTANCES FROM THE POINTS [1/16,3/16,5/16,7/16]

$d_0 \triangleq dis(1/16, X),$
$d_1 \triangleq dis(3/16, X),$
$d_2 \triangleq dis(5/16, X),$
$d_3 \triangleq dis(7/16, X),$

UNIFIED TECHNIQUE FOR MULTI-RATE TRELLIS CODING AND DECODING

BACKGROUND OF THE INVENTION

1. Field of the Invention

The present invention relates to channel coding and decoding in digital communications, particularly high-speed, broadband wireline communications.

2. State of the Art

Channel coding refers to data transformations, performed after source encoding but prior to modulation, that transform source bits into channel bits. Trellis coding is one class of channel coding. Trellis encoders and decoders find widespread use in digital communications, an example of such use being xDSL modems such as HDSL2/G.SHDSL modems. One specific trellis decoder is the Viterbi decoder. Trellis encoders and Viterbi decoders are described, for example, in U.S. Pat. No. 5,457,705, incorporated herein by reference.

A block diagram of a known data transmission system using a trellis encoder and a Viterbi decoder is shown in FIG. 1 and includes a transmitter comprising convolutional encoder 41, mapping circuit 42 for setting an arrangement of signal points, and 8-PSK (phase shift keying) modulator 43 for phase-modulating which is supplied with 8 signal points generated by $2^3$ bits, and a receiver comprising 8-PSK demodulator 44 and Viterbi decoder 45. Convolutional encoder 41 produces output signal points $Y_2$, $Y_1$, $Y_0$ that are mapped into the position shown in FIG. 2 of the accompanying drawings by mapping circuit 42 and then modulated by 8-PSK modulator 43 for transmission to a transmission path. The 8-phase-modulated signal, with noise added during transmission, is demodulated into m-bit soft decision I channel, Q channel (I-ch., Q-ch.) data by 8-PSK demodulator 44. The m-bit soft decision I-ch., Q-ch. data are supplied to Viterbi decoder 45, which produces estimated information data d. Although different data transmission systems use different modulation coding arrangements, some of which may only be one-dimensional instead of two-dimensional (I, Q), the foregoing system may be regarded as exemplary for purposes of the present discussion.

A block diagram of a typical trellis encoder, or convolutional encoder, is shown in FIG. 3, operation of which will be described. Convolutional encoder 41 is supplied with parallel information bits $X_1$, $X_2$ that have been converted by serial/parallel converter 101 connected to input terminals 77, 78 of convolutional encoder 41. If the encoding ratio is 2/3, then exclusive-OR gates 85, 86 of convolutional encoder 41 output exclusive-OR of information bits $X_1$, $X_2$ supplied from input terminals 77, 78 and output signals from shift registers 82, 83, and are stored in respective shift registers 83, 84. At this point, convolutional encoder 41 outputs, as encoded data, output signals $Y_1$, $Y_2$ as respective information bits $X_1$, $X_2$ and redundancy bit $Y_0$ from respective output terminals 80, 79, 81. Each time information bits $X_1$, $X_2$ are inputted, convolutional encoder 41 repeats the above operation and produces output data $Y_1$, $Y_2$, $Y_0$. Output data $Y_1$, $Y_2$, $Y_0$ are then mapped into the positions shown in FIG. 2 by mapping circuit 42 of FIG. 1. If there are three input information bits $X_1$, $X_2$, $X_3$ and the encoding ratio is 3/4, then, assuming that convolutional encoder 41 is used, convolutional encoder 41 adds redundancy bit $Y_0$ depending on information bits $X_1$, $X_2$ to information bits $X_1$, $X_2$, $X_3$, and produces 4-bit output data.

Operation of Viterbi decoder 45 will be described below with reference to FIG. 4, FIG. 5, FIG. 6, and FIG. 7 of the accompanying drawings. FIG. 4 shows the trellis transition of convolutional encoder 41. FIG. 5 shows an ACS (add compare select) circuit composed of adders 50 through 53, comparator 54, and selector 55, and FIG. 6 also shows the ACS circuit. FIG. 7 shows Viterbi decoder 45. In FIG. 7, the m-bit soft decision I ch., Q ch. data decoded from an 8-PSK signal are supplied from input terminals 87, 88, respectively, to branch metric generator 89, which determines likelihood estimates (branch metrics) BM0, BM1, ..., BM7 between the 8-phase signal points and reception points as shown in FIG. 2. The likelihood estimates BM0, BM1, ..., BM7 are supplied to ACS circuit 90. To process a 0th state as shown in FIG. 5, branch and path metrics BM0', PM0, branch and path metrics BM2', PM2, branch and path metrics BM4', PM4, and branch and path metrics BM6', PM6 are added by respective adders 50, 51, 52, 53, and a path metric with maximum likelihood is calculated by comparator 54 and selected by selector 55 as a path metric PM0 on the next occasion. It is assumed that a path that has transited from a 4th state is selected. Upon selection of the path, the history data of the path stored in 4th-state shift register 75 (see FIG. 6) in path memory 91 is shifted to the right into 0th-state shift registers 73 by select signals SEL0 applied to selectors 56, 60, 64, 68, so that 0th-state shift registers 73 store two information bits "01" that are a transition output. Similarly, the above operation is simultaneously carried out with respect to the 1st, 2nd, ..., 7th states by circuits based on the trellis transition shown in FIG. 4. Each time a received symbol is inputted, path metrics PM0–PM7 with maximum likelihood are detected by maximum likelihood decider 92, and the output signal from the final shift register which represents the state of the most likelihood path is selected by selector 72, thus producing estimates $X_2$, $X_1$ indicative of estimated decoded bits.

In order to cover a wide variety of services XDSL standards, such as G.SHDSL, typically specify more than one data rate. Moreover, past experience dictates the need for higher and higher data rates. There are various ways to address this issue of high data rate system with multi-rate functionality. One straightforward approach is to increase the bandwidth of the transmitted signal in proportion to the required data rate. However, this is not a very efficient use of the bandwidth. Another approach is to change the number of bits per symbols, i.e., more bits per symbols for higher data rates. In this approach it is not necessary to increase the bandwidth.

The difficulty of the variable bits per symbol is that if proper care is not taken, the associated trellis encoding/decoding arrangement can become unduly complex. What is needed is a careful design of the trellis encoding/decoding arrangement so that the multiple bits per symbol for various data rates can be used seamlessly. The present invention addresses this need.

SUMMARY OF THE INVENTION

The present invention, generally speaking, provides efficient trellis encoder/decoder structure that is suitable for accommodating multiple bits per transmitted symbol. On the encoder side for every rate we map the input bits to a transmitted symbol in such a way that the logic required for decoding the encoded bits is virtually the same irrespective of the number of bits per symbol. This results in greatly simplified decoder structure.

BRIEF DESCRIPTION OF THE DRAWING

The present invention may be further understood from the following description in conjunction with the appended drawing. In the drawing:

FIG. 12 is a diagram further elaborating the state diagram of FIG. 11;

FIG. 13 is a block diagram of a multi-rate constellation mapper;

FIG. 14 is a modified bits-to-symbol mapping for 16 PAM allowing for simplified decoding of multi-rate signals;

DETAILED DESCRIPTION OF THE PREFERRED EMBODIMENTS

Figure 1:
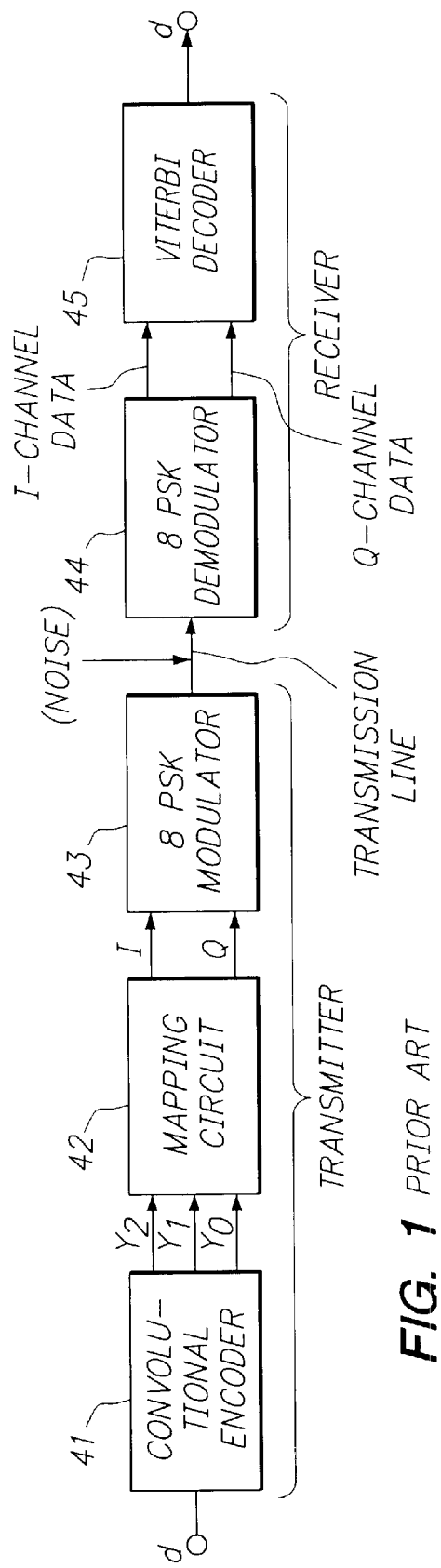
FIG. 1 is a block diagram of a conventional data transmission system.
Figure 2:
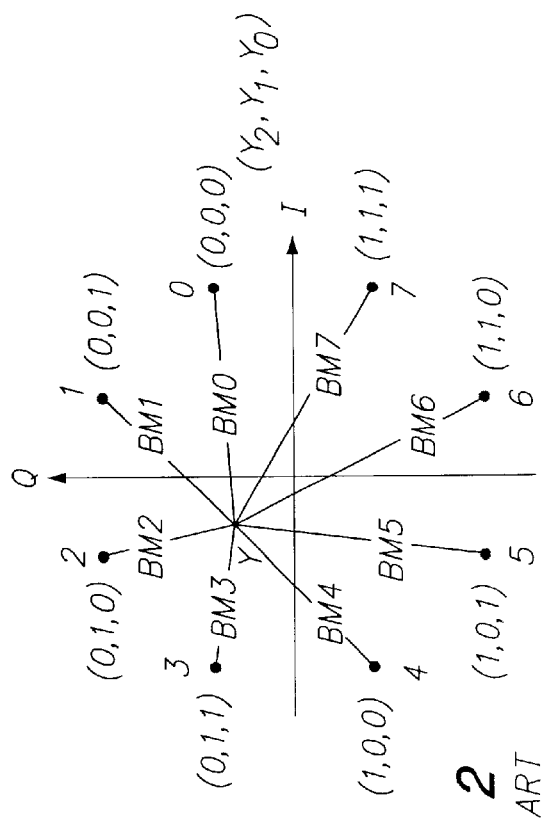
FIG. 2 is a diagram illustrating signal points in the data transmission system of FIG. 1.
Figure 3:
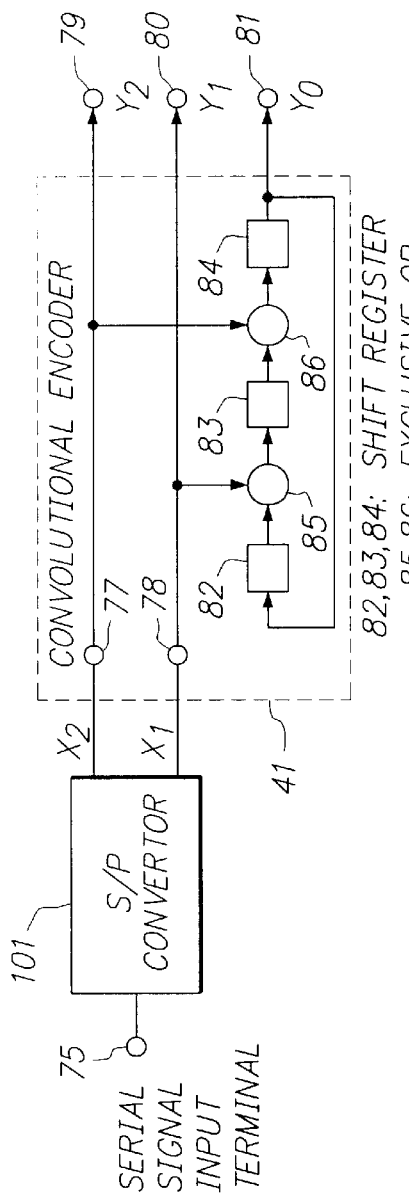
FIG. 3 is a block diagram of a conventional trellis encoder.
Figure 4:
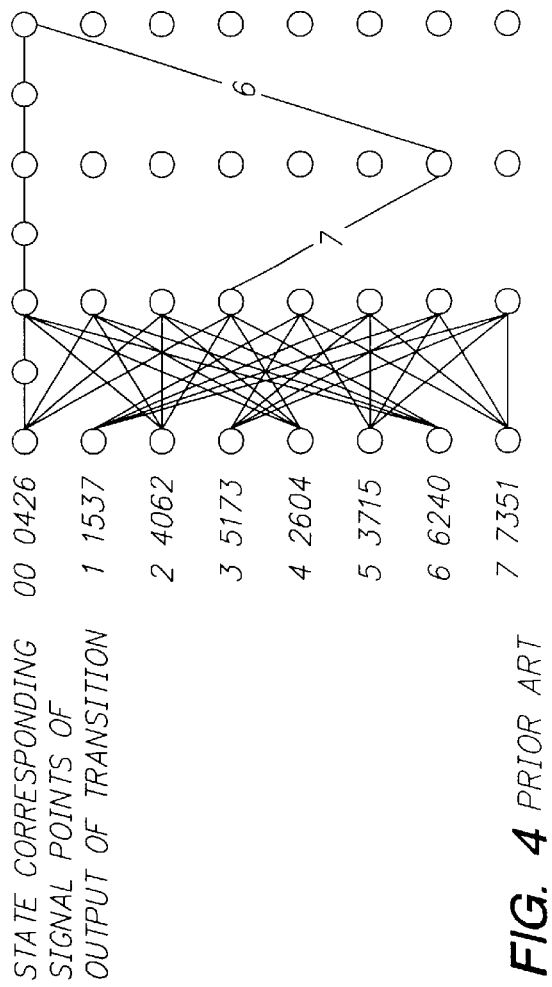
FIG. 4 is a diagram showing a conventional trellis transition with an encoding ratio of 2/3.
Figure 5:
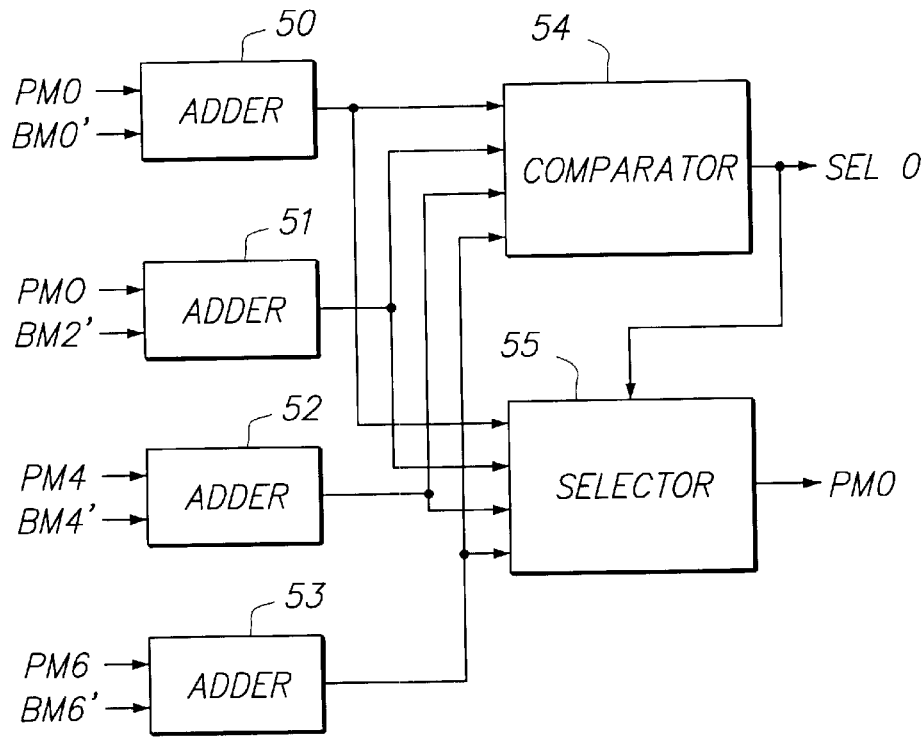
FIG. 5 is a block diagram of a conventional ACS circuit.
Figure 8:
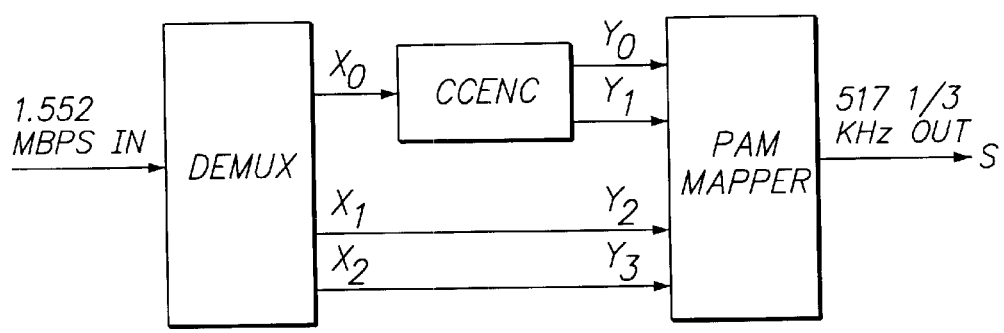
FIG. 8 is a block diagram of a conventional 16 PAM trellis encoder used in HDSL2 systems.

Referring now to FIG. 8, a block diagram is shown of a conventional 16 PAM trellis encoder used in HDSL systems. A data binary signal (having a rate of 1.552 Mbps, for example) is input to a serial-to-parallel converter that produces parallel bits $x_0$, $x_1$ and $x_2$. Bits $x_1$ and $x_2$ are uncoded bits. Redesignated as $y_2$ and $y_3$, respectively, they are applied directly to a PAM mapper. Bit $x_0$ is to be encoded and, therefore, applied to a convolutional encoder of the type shown in FIG. 9, for example, comprising a chain of flip-flops, selected output signals of which are exclusive-ORed in the manner indicated. In this manner, the convolutional encoder produces encoded bits $y_0$ and $y_1$, which are applied to the PAM mapper. The PAM mapper performs a bit-to-symbol mapping and outputs a 1/3 rate signal, e.g., a 517K symbols per second for input rate of 1.552 Mbps.

Figures 10, 11:
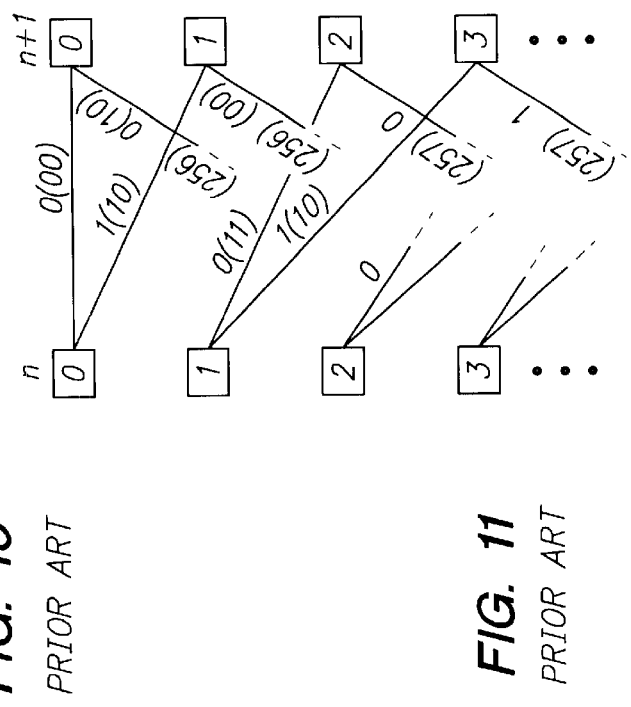
FIG. 10 is a diagram illustrating a bits-to-symbol mapping of the convolutional encoder of FIG. 8.
FIG. 11 is a state diagram of the convolutional encoder of FIG. 8.

Referring to FIG. 10, the bits $y_3y_2y_1y_0$ may be represented by a 12-bit value having a first 5-bit portion including a sign bit a four magnitude bits and a 7-bit zero-filled portion. The number of zero-filled bits determines the precision available for soft decision on the decoder and the overall performance of the trellis encoded modulation scheme.

Figure 9:
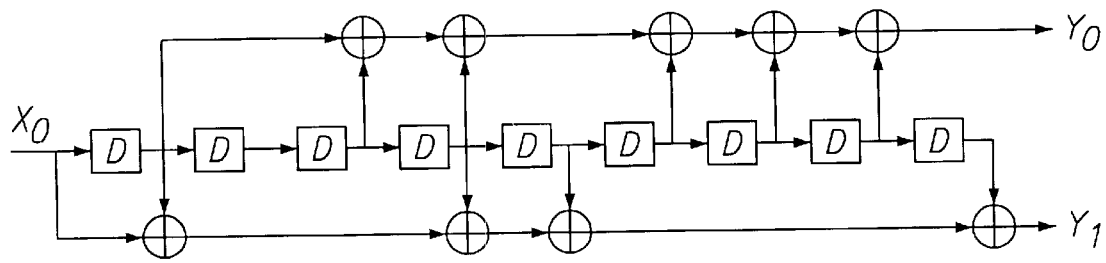
FIG. 9 is a block diagram of the convolutional encoder of FIG. 8.
Figure 6:
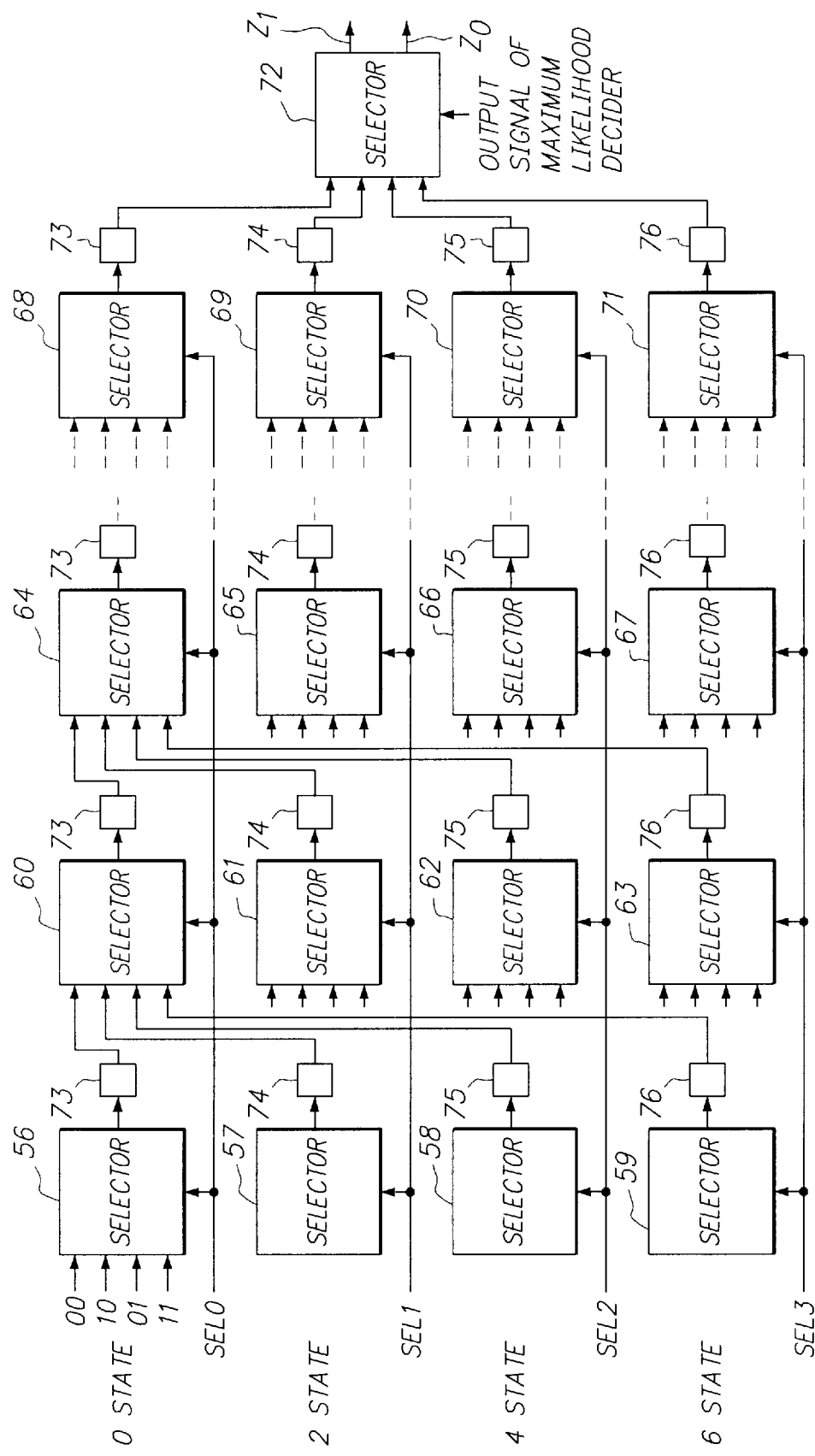
FIG. 6 is a block diagram illustrating a selection sequence of the ACS circuit of FIG. 5.
Figure 7:
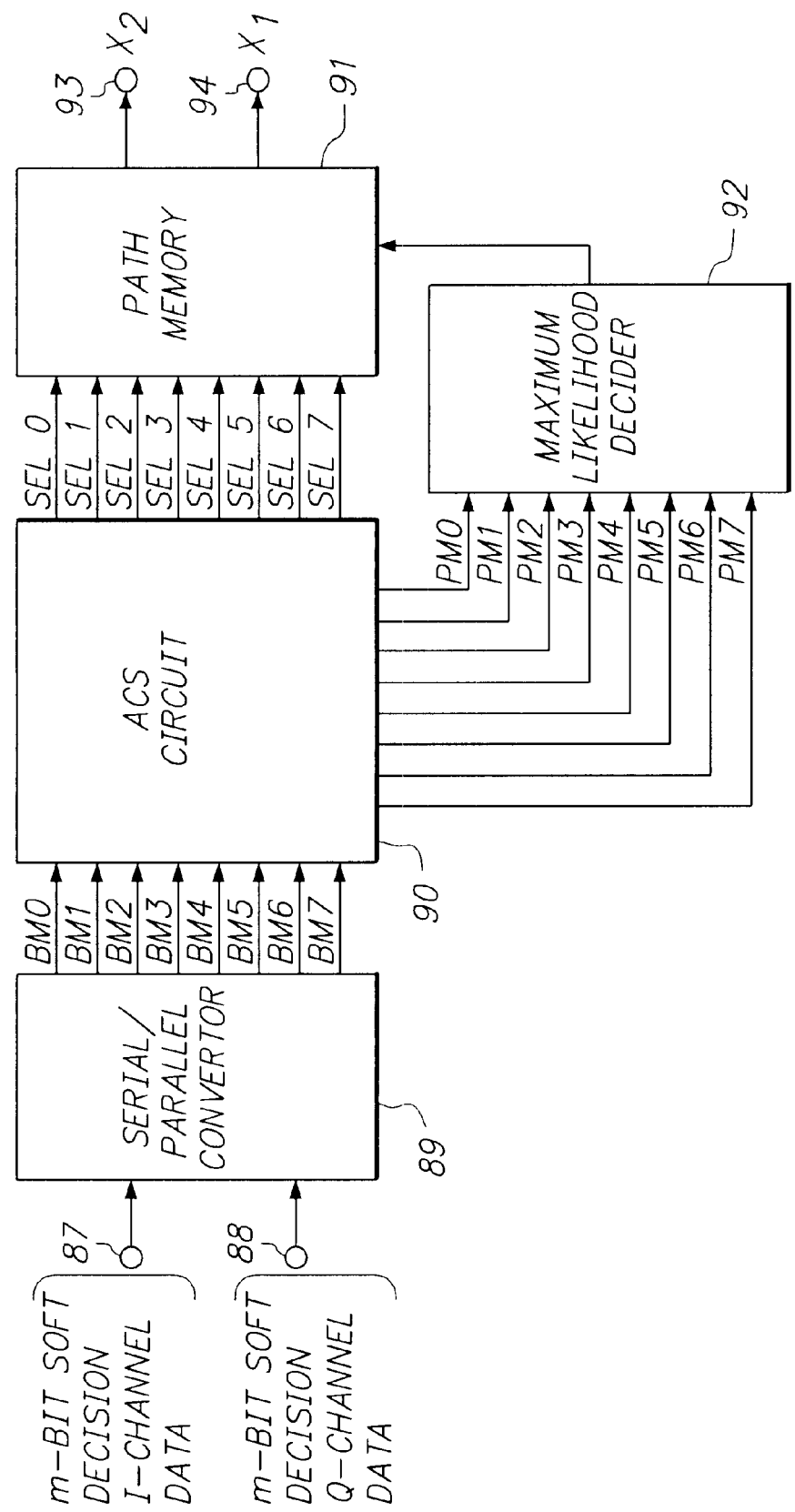
FIG. 7 is a block diagram of a conventional Viterbi decoder.

Referring now to FIG. 11, a state diagram is shown of the trellis encoder of FIG. 9. Since the trellis encoder has nine flip-flops, it is described by $2^9=512$ states. The transition from one state to the next is governed by the next input bit to the trellis encoder. In FIG. 11, a possible transition is represented by a line from one state to another state labelled with the binary logic value (0 or 1) of the data bit causing the transition and, in parentheses, the logic values of the two output bits produced by the trellis encoder. For example, if the trellis encoder is in state 0 at time n and the next input bit is a 0, the trellis encoder will remain in state 0 at time n+1 and will produce an output of 00. If the trellis encoder is in state 0 at time n and the input next bit is a 1, the trellis encoder will transition to state 1 at time n+1 and will produce an output of 10. As illustrated in FIG. 12, states i and i+256 enter the same next state for the same input bit but different outputs are produced. For example, if the trellis encoder is in state 0+256=256 at time n and the next input bit is a 0, the trellis encoder will transition to state 0 at time n+1 but will produce an output of 10.

A significant feature of the present system is the ability to use the same decoder structure with signals of different data rates. This ability is made possible in part by adopting a different bits-to-symbol mapping than that used in the prior art. Referring more particularly to FIG. 13, a multi-rate constellation mapper is shown. The constellation mapper has different modes, allowing for different numbers of uncoded bits to be represented in a transmit data symbol. FIG. 14 shows a bits-to-symbol mapping employed by the constellation mapper of FIG. 13 in a 16 PAM mode (two uncoded bits). The interval [−1, 1) is represented, including the values −15/16, −13/16, etc., the denominator being implied rather than explicitly indicated. Beginning at the left hand side of the interval, the values of the symbols $y_3y_2y_1y_0$ progress from zero (0000, mapped to −15/16) to 15 (1110, mapped to −1). As may be seen with reference to FIG. 10, this portion of the mapping is the same as in the prior art. In the right half of the interval, however, this portion of the interval may be imagined as being divided again in half, with the values that would ordinarily appear in one quarter section of the interval being swapped with the values that would ordinarily appear in the other quarter section of the interval. Hence, instead of the symbols values progressing from left to right as 8, 9, 10, etc., they progress as 12, 13, 14, 15, 8, 9, 10, 11. The reason for this mapping will become more apparent from the following description of the decoder structure of the present system.

Figures 15, 16, 17, 18:
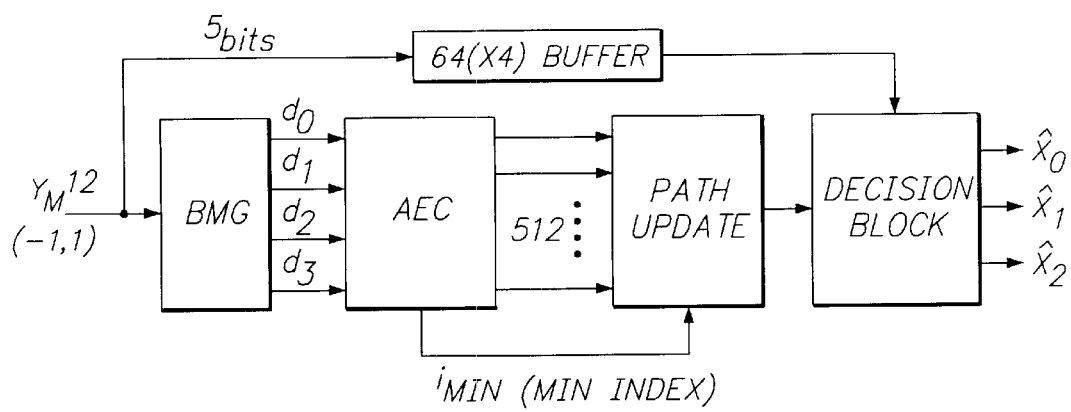
FIG. 15 is a bits-to-symbol mapping for 8 PAM.
FIG. 16 is a bits-to-symbol mapping for 4 PAM.
FIG. 17 is a bits-to-symbol mapping for 2 PAM.
FIG. 18 is a block diagram of a Viterbi decoder in accordance with an exemplary embodiment of the present invention.

Mappings for 8 PAM, 4 PAM and 2 PAM are shown in FIG. 15, FIG. 16, and FIG. 17, respectively. The mappings for 8 PAM and 2 PAM may be considered to be consistent with the prior art mapping of FIG. 10. In the mapping for 4 PAM, however, as compared to what would be the expected mapping based on FIG. 10 (e.g., from left to right, 00xx, 01xx, 10xx, 11xx), the symbols are exchanged between the left and right halves of the interval, and then, within the left half of the interval, the symbols are exchanged again.

Referring to FIG. 18, a block diagram is shown of a decoder in accordance with an exemplary embodiment. In this embodiment, the input signal to the decoder is a value $y_m$ (which may be represented in signed two's complement form) on the interval [−1, 1), represented in this instance using 12 bits. The output of the decoder is a maximum-likelihood symbol estimate, assuming guassian noise, composed of bit estimates $\hat{x}_2$, $\hat{x}_1$ and $\hat{x}_0$, produced by a decision block using a most-recent estimate of the original encoded bit and the most significant five bits of $y_m$, delayed by 64 symbols period within a buffer. Hence, the trellis decoder has a history depth of 64 symbols.

Figure 19:
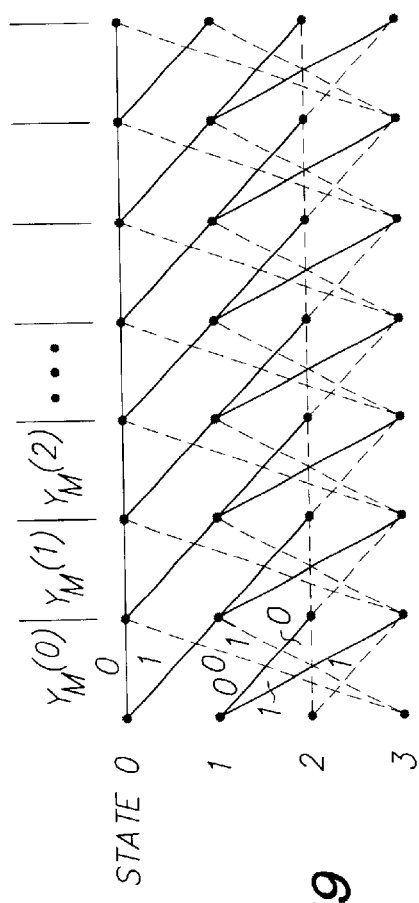
FIG. 19 is a partial trellis diagram corresponding to the state diagram of FIG. 11.

The major portion of the work of the decoder is performed by the Branch Metric Generator (BMG), Add-Compare-Select (ACS), and Path Update blocks. Prior to describing an advantageous implementation of these blocks in accordance with one embodiment of the invention, the trellis representing operation of the decoder will be described with reference to FIG. 19. FIG. 19 represents a partial trellis derived from the state diagram of FIG. 11. Each transition from one state to the next within the trellis corresponds to a new value of $y_m$. Transitions indicated in solid lines are between states shown within the partial trellis diagram of FIG. 19.

Figure 20:
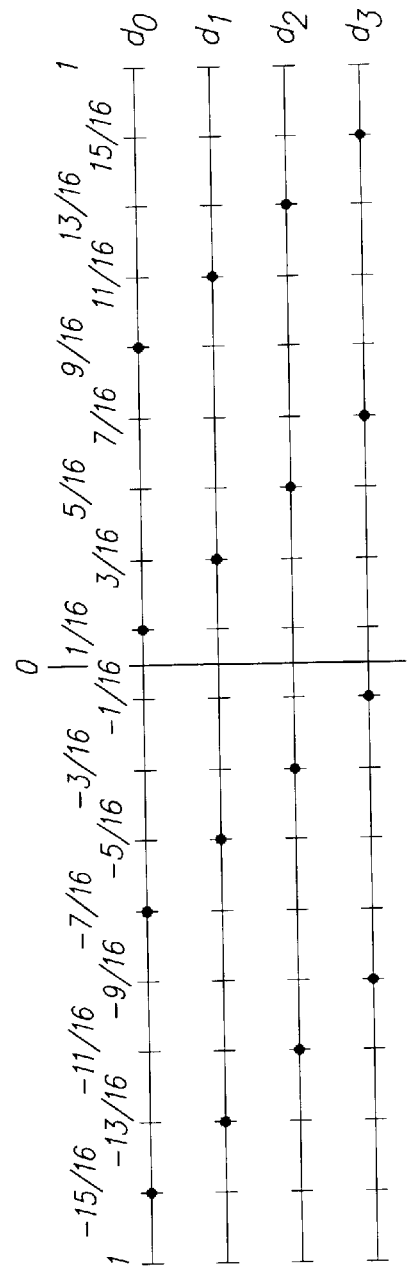
FIG. 20 is a diagram illustrating cosets used by the Branch Metric Generator of FIG. 18.

Referring now to FIG. 20, operation of the Branch Metric Generator of FIG. 18 will be described. With two encoded bits, $y_1$ and $y_0$ (FIG. 9), four combinations of $y_1 y_0$ are possible, namely 00, 01, 10, 11. Depending on the uncoded bits $y_3 y_2$, the combination $y_1 y_0 = 00$ may correspond to any of four different symbol values, −15/16, −7/16, 1/16 or 9/16. At the decoder, the minimum distance of the received symbol from this set of points is designated as $d_0$. (Note that the decimal value of the subscript is the same as the binary value of $y_1 y_0$.) The distances $d_1$, $d_2$, and $d_3$ are similarly defined. Each set of points used to compute, respectively, $d_0$, $d_1$, $d_2$, and $d_3$, defines a "coset."

Figure 21:
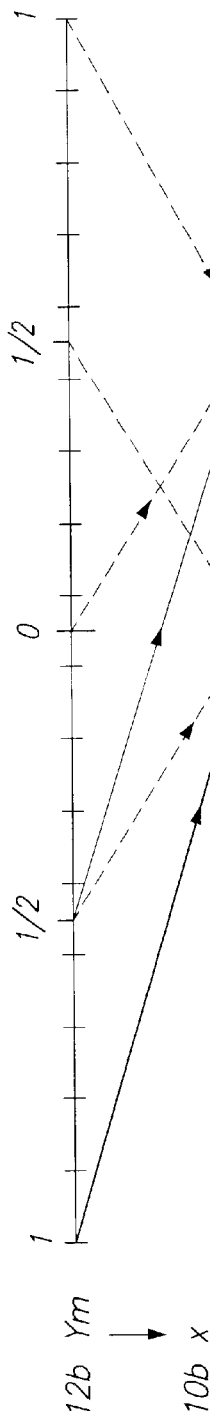
FIG. 21 is a diagram illustrating the effect of a truncation operation performed by the Branch Metric Generator of FIG. 18.

Instead of calculating the distance between the received symbol and all of the points of the constellation, significant efficiency is gained by, for purposes of calculating distances, obtaining a quantity x from $y_m$ by (in the case of 16 PAM) dropping the two most significant bits from $y_m$ as shown in FIG. 21. The effect is to map all of the points in the constellation to a single interval [0, 1/2) The distance $d_0$ is then defined as dis(1/16, x), the distance $d_1$ as dis(3/16, x), etc. As a result, instead of 16 values, the Branch Metric Generator is required to generate for each received symbol only the four values, $d_0$, $d_1$, $d_2$, and $d_3$. Note in FIG. 21 that the transformation from $y_m$ to x causes symbol values originally within the interval [0, 1/2) to be flipped about the midpoint of the interval. The various symbols mappings of FIG. 14, FIG. 15, FIG. 16 and FIG. 17 account for this occurrence. The values $d_0$, $d_1$, $d_2$, and $d_3$ is squared to achieve optimum performance.

The transformation from $y_m$ to x varies slightly between modes as shown in Table 1:

TABLE 1

4 PAM Mode

For the 4 PAM mode, out of the 12-bit input received, the 10 MSBs are selected.
Input 12-bits:
y = y(0:11) = y(0) y(1) y(2) y(3) y(4) y(5) y(6) y(7) y(8) y(9) y(10) y(11)
Selected 10 bits:
x(0:9) = y(0:9) = y(0) y(1) y(2) y(3) y(4) y(5) y(6) y(7) y(8) y(9)

TABLE 1-continued

8 PAM Mode

For the 8 PAM mode, out of the 12-bit input received, the middle 10 bits are selected.
Input 12-bits:
y = y(0:11) = y(0) y(1) y(2) y(3) y(4) y(5) y(6) y(7) y(8) y(9) y(10) y(11)
Selected 10 bits:
x(0:9) = y(1:10) = y(1) y(2) y(3) y(4) y(5) y(6) y(7) y(8) y(9) y(10)

16 PAM Mode

For the 16 PAM mode, out of the 12-bit input received, the 10 LSBs are selected.
Input 12-bits:
y = y(0:11) = y(0) y(1) y(2) y(3) y(4) y(5) y(6) y(7) y(8) y(9) y(10) y(11)
Selected 10 bits:
x(0:9) = y(2:11) = y(2) y(2) y(3) y(4) y(5) y(6) y(7) y(8) y(9) y(10) y(11).

Figure 22:
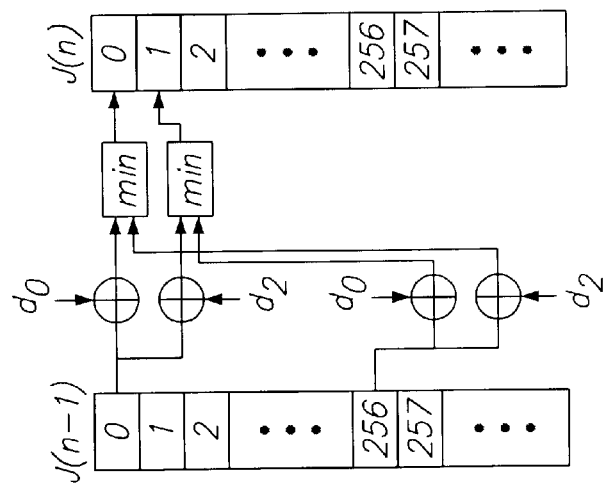
FIG. 22 is a diagram illustrating operation of the ACS block of FIG. 18.

The ACS block of FIG. 18 may be realized as shown diagrammatically in FIG. 22. Storage is provided for two vectors (each of, e.g., dimension of 512). One, J(n−1), is used to stored prior path-weight sums, and the other, J(n), is used to stored new path-weight sums derived from the prior path-weight sums. Each element of the vector J(n) is derived, in accordance with the state diagram of FIG. 11, as the minimum of: 1) the sum of a first selected element of the vector J(n−1) and a selected one of the distances $d_0$, $d_1$, $d_2$, and $d_3$; and 2) the sum of a second selected element of the vector J(n−1) and a selected one of the distances $d_0$, $d_1$, $d_2$, and $d_3$. In the case of $J_0(n)$, for example, one observes from the state diagram of FIG. 11 that state 0 may be arrived at from state 0 if the output $y_1 y_0 = 00$ (to which $d_0$ corresponds) or from state 256 if the output $y_1 y_0 = 10$ (to which $d_2$ corresponds). The most likely path of the two paths is the one with the minimum path weight. In general, $$J_{\varnothing}(n) = \min \begin{Bmatrix} J_{i\varnothing ||\downarrow}(n-1) + d_{\dot{A}_{set}\backslash\varnothing\backslash\epsilon\div} \equiv C_\epsilon[i] \\ J_{[\varnothing\ |!+||\rightarrow\rightarrow}(n-1) + d_{\dot{A}_{set}\backslash\varnothing\backslash\cap\div} \equiv C_\cap[i] \end{Bmatrix}$$

where $\lfloor X \rfloor$ is the largest integer not exceeding X, the floor operation, and where the appropriate $D_{set}$ value ($d_0$, $d_1$, $d_2$, or $d_3$) in any particular instance is determined by look-up table, for example. Application of the foregoing expression is demonstrated by the following examples:

$$J_{\Sigma\rightarrow\cap}(n) = \min\{J_{\cap i \in}(n-1) + d_\cap, J_{\infty\Sigma}(n-1) + d_\Sigma\}$$

Since all decisions depend on the relative values, not absolute values, of $J_i(n)$'s, to avoid saturation, the values of $J_i(n)$ may be adjusted by subtracting the following quantity:

$$J_{\min}(n-1) \equiv \min_i J_i(n-1)$$

The Path Update block of FIG. 18 principally comprises a traceback table for storage of the received data sequence history. In an exemplary embodiment, the traceback table requires 512 by 64 bits of storage. A path update operation, in accordance with an exemplary embodiment, consists of 1) a series of row-switching operations; 2) a decision step performed in cooperation with the ACS block; and 3) an update operation in which the oldest column of the traceback table is dropped to accommodate the addition of a new column.

The new column to be added is calculated as a 512 vector of 0's and 1's, dec[i], in conjunction with the calculation of J(n) of the ACS block, as follows:

dec[i]=0 if $C_e[i] \leq C_n[i]$ dec[i]=1 if $C_n[i] \leq C_e[i]$

Each bit dec[i] represents the most likely value of the encoded bit $x_0$ assuming the most likely trellis path (of history depth 64 in this example) ending in a particular state. Each row of the traceback table implicitly represents one such path.

Figure 23:
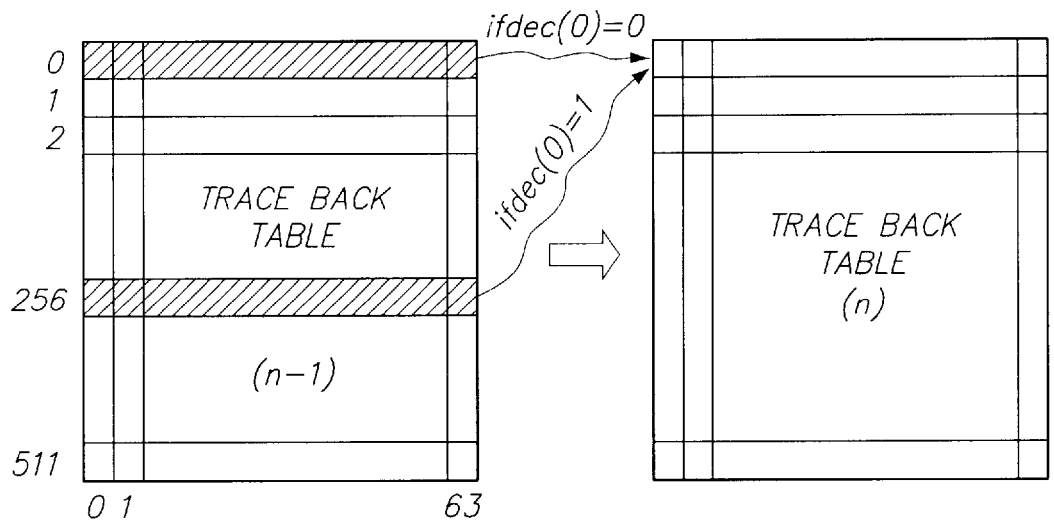
FIG. 23 is a diagram illustrating a row switching operation performed by the Path Update block of FIG. 18.

After the new column to be added has been calculated, row switching is performed as illustrated in FIG. 23. As may be appreciated from the preceding discussion, the ith state of the trellis encoder is preceded by either the $\lfloor i/2 \rfloor^{th}$ state or the $\lfloor i/2 \rfloor + 256^{th}$ state. Therefore, during traceback table update, the $i^{th}$ row of the traceback table is replaced by either the $\lfloor i/2 \rfloor^{th}$ row or the $\lfloor i/2 \rfloor + 256^{th}$ row depending on whether dec[i] is 0 or 1, as shown in FIG. 23. For i=10, for example, the $10^{th}$ row of the traceback table is replaced by the 5th row if dec[10]=0, else by the $261^{st}$ row if dec[10]=1.

Following row switching, a decision bit, $\hat{x}_0$, for the current cycle is produced by using the minimum value of the ACS vector $J_i(n)$ to index into the first column of the traceback table. That is, $\hat{x}_0$ is the min_J_loc$^{th}$ bit of the first column of the traceback table after row switching where $$\text{min\_j\_loc} = \arg\min_i J_i(n)$$

Figure 24:
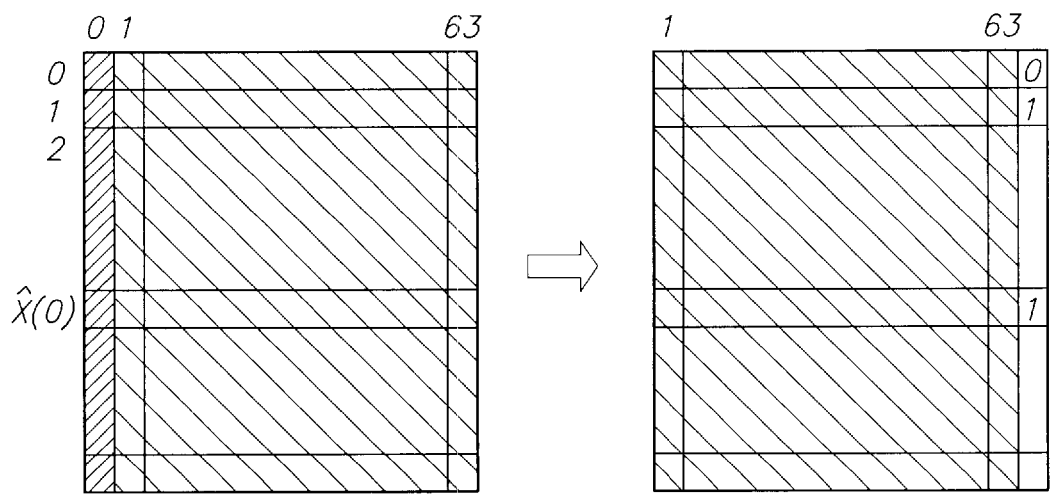
FIG. 24 is a diagram illustrating a traceback table update operation performed by the Path Update block of FIG. 18.

After the decision bit has been produced, the traceback table is updated by dropping the first column and adding a new last column computed along with the vector $J_i(n)$ as previously described. Update of the traceback table is illustrated in FIG. 24.

Figure 25:
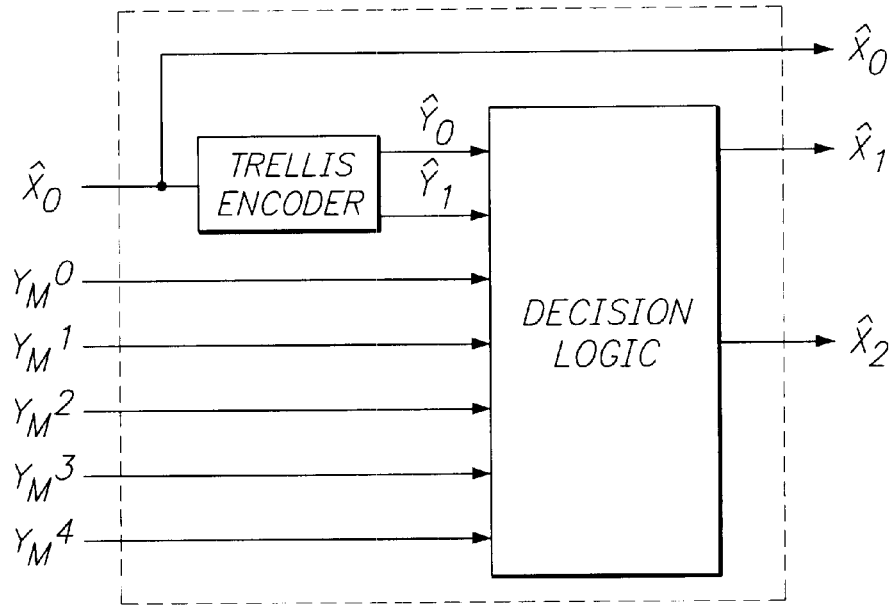
FIG. 25 is a block diagram of the Decision block of FIG. 18.

The Decision block of FIG. 18 is shown in greater detail in FIG. 25. The decision bit $\hat{x}_0$ is output directly. Although the uncoded bits $\hat{x}_1$ and $\hat{x}_2$ could be estimated directly from $y_m$, greater accuracy may be obtained by passing the decision bit $\hat{x}_0$ through an identical trellis encoder as used at the transmit side to produce estimates of $\hat{y}_0$ and $\hat{y}_1$. Decision logic uses these estimates together with $y_m$ to estimate the uncoded bits $\hat{x}_1$ and $\hat{x}_2$.

Figure 26:
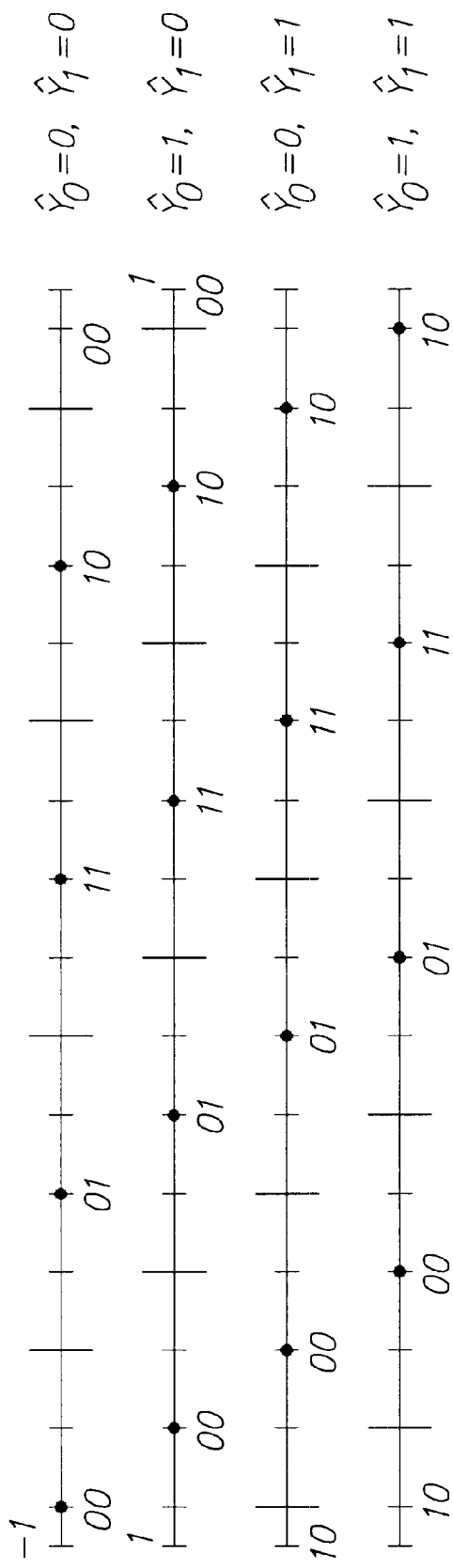
FIG. 26 is a diagram illustrating operation of the Decision block of FIG. 18.

Operation of the decision logic of FIG. 25 is illustrated in FIG. 26. Different levels are used by the decision logic depending on the estimates of $\hat{y}_0$ and $\hat{y}_1$. The significance of using different levels may be appreciated with reference to FIG. 18. Ignoring $y_0$ and $y_1$, distinguishing between different combinations of $y_2$ and $y_3$ requires accurately resolving the signal to within ½ the symbol interval, e.g., ½ (2⁄16)=1⁄16. Identical combinations of $y_0$ and $y_1$, however, occur at a much wider interval, e.g., 4 symbol intervals. By using decision levels equidistant from identical combinations of $y_0$ and $y_1$, the required precision is only ½ (8⁄16)=4⁄16. Greater accuracy therefore results.

The efficient structure of the present decoder lends itself to more dense constellations, allowing for the possibility of increasing the transmit data rate by increasing the number of uncoded bits. In the example of HDSL2/G.SHDSL, for example, the number of uncoded bits may be increased by 1, 2, etc., resulting in 32 PAM, 64 PAM, etc. A description of how such higher data rates may be achieved is set forth in Appendix A.

Figure 27:
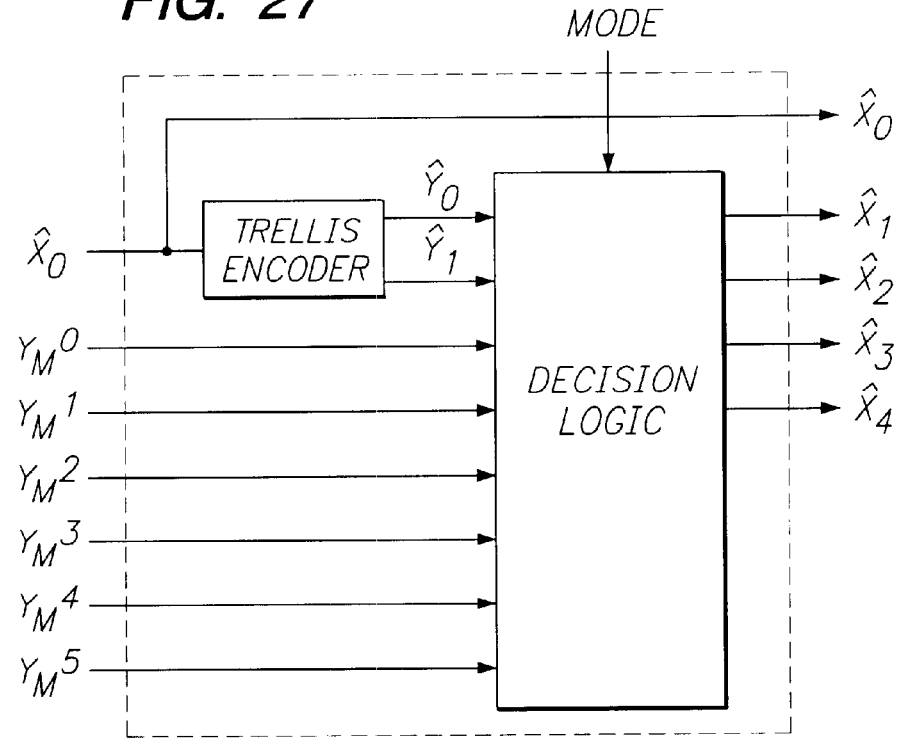
FIG. 27 is a block diagram of a more generalized Decision block that may be used in conjunction with a transmitter having a higher than normal data rate.

A block diagram of a more generalized Decision block allowing for multi-rate capabilities is shown in FIG. 27. The Decision block, which may be used with 4, 8, 16, 32 or 64 PAM signals, receives one additional input bit, $y_5$, and produces up to two additional output bits, $\hat{x}_3$ and $\hat{x}_4$. A mode signal causes the decision logic to operate in accordance with the desired mode.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

APPENDIX

1 Encoder and Mapper

The encoder takes n uncoded input bits and generates n + 1 coded output bits. Out of the n input bits, $x_1, x_2, \ldots, x_n$, only the first bit, $x_1$ goes though a trellis encoder. The trellis encoder is a ½ rate encoder, i.e., it generates 2 output bits $y_1$ and $y_2$ for every input bit $x_1$. The rest of the input bits, $x_2, x_3, \ldots, x_n$, is unchanged and passed to the output and labeled as follows:

$$x_2 \rightarrow y_3$$

$$x_3 \rightarrow y_4$$

$$\vdots \quad \vdots \quad \vdots$$

$$x_n \rightarrow y_{n+1}.$$

The n + 1 bits output of the encoder is then mapped to a $2^{(n+1)}$-PAM (Pulse Amplitude Modulation) constellation. For example, if n = 4, the 5 bit output of the encoder is mapped to a 32-PAM constellation. In this document we only consider the values of n equal to or larger than 4. i.e., 32-PAM or higher constellation. In our convention, the bit labeled $y_1$ is the LSB (Least significant Bit) and $y_{n+1}$ is the MSB (Most Significant Bit). The (n + 1) output bits is mapped to $2^{(n+1)}$-PAM as follows. Let M = $2^{(n+1)}$, the M normalized constellation points are defined as follows the i-th point $\triangleq$ (2i − M + 1)/M, i = 0, . . . , M − 1.

APPENDIX-continued

For n = 4, we have M = 32, and the normalized 32 constellation points are
(2i − 31)/32, i = 0, ..., 31.
Let $$p = \sum_{i=1}^{n+1} 2^i y_i,$$

be the decimal representation of the (n + 1) bits, assuming that $y_1$ is the LSB. Then the (n + 1) bits $y_1, y_2, \ldots, y_{(n+1)}$ is mapped to the p-th normalized constellation point, i.e.,
$$y_1, y_2, \ldots, y_{(n+1)} \rightarrow (2p - M + 1)/M, p = 0, \ldots, M - 1.$$
For example, in the case of n = 4, $[y_{n+1} \ldots y_1]$ = 00101 is mapped to the point −21/32.

All the normalized constellation points will be represented using B binary bits in 2's compliment form. The number of bits B is larger than (n + 1) and the extra bits B − n − 1 determines the precision available for soft decision on the decoder and the over all performance of the trellis coded modulation scheme. We suggest that for reasonable performance at least 8 extra bits be provided for soft decision, i.e., B ≥ n + 9.

2 The Decoder

The major blocks of the decoder remains the same expect for: i) the bits selected the computation of the four distances $d_0, d_1, d_2$, and $d_4$ and ii) the number of bits stored to decode the uncoded bits and the decoding table for those uncoded bits. The differences are described below.

2.1 Bit selection for distance calculation

The input to the trellis decoder is B bit wide. Let P is the number of extra bits allocated for precision of the soft decisions, i.e., P = B − n − 1. We will assume that P > 8. Let the input B bit wide numbers are represented as
$$z_1 z_2 z_3 \ldots z_B,$$
where $z_1$ is the sign bit and $z_B$ is the LSB. Out of these B bits we select the P + 2 bits for the calculation of the distance. Let the selected bits are represented as
$$x_1 x_2 \ldots x_{P+2},$$
then $$z_n \rightarrow x_1$$
$$z_{n+1} \rightarrow x_2$$
$$\vdots \quad \vdots \quad \vdots$$
$$z_{n+P+1} \rightarrow x_{P+2}.$$

In other words, we drop the first n − 1 bits and select the rest for the distance calculation.

The exact computation of the distances follows similar steps as in the 16-PAM case.

2.2 Decoding of the uncoded (n − 1) MSBs

For decoding the n − 1 uncoded MSBs we store the first n + 2 bits. $z_1, z_2, \ldots, z_{(n+2)}$, of the input in a buffer. The length of the buffer is identical to the trace back depth of the decoder.

the n − 1 uncoded MSBs are decoded using the stored n + 2 bits of the B bit wide decoder input along with the 2 bit encoder output. Assuming that the n + 2 bits are singed integer, let I is the decimal representation of that n + 2 bit. note that I can range from −M to M − 1, where M = $2^{(n+1)}$. Using this definition, the decoding rules are summarized below.

Let the 2 bit encoder output be represented by $\hat{y}_1 \hat{y}_0$ and $$K \triangleq \left\lfloor \frac{I + 3 + M - y*2}{8} \right\rfloor$$

where $y \triangleq 2 * \hat{y}_1 + \hat{y}_0$ and $\lfloor x \rfloor$ is the largest integer not exceeding x, for example $\lfloor 2.9 \rfloor$ = 2. Note that K lies in the range 0 to $2^{n-1}$ − 1. Thus K can be represented by n − 1 bits in unsigned mode. The decoded bits are the binary representation of the number K.

This completes the decoding scheme.

What is claimed is:

1. In a digital transmission system in which data symbols are transmitted using a convolutional encode channel coding arrangement and a one-dimensional modulation coding arrangement, a method of varying data transmission rate, comprising:

within a framework of the one-dimensional modulation coding arrangement, identifying a set of modulated values;

for each of multiple different data rates, performing convolutional coding by operating on m data bits to produce n data bits where n>m, the particular m data bits being operated upon being the same for each different data rate;

for one data rate, mapping data symbols including a portion of said m data bits to a complete set of said modulated values; and for another different data rate, mapping data symbols including a portion of said m data bits to a subset of said modulated values.

2. The method of claim 1, wherein the number of modulated values is $2^k$ where k≥2.

3. The method of claim 2, wherein k=4.

4. The method of claim 2, wherein the digital data transmission system is an xDSL system.

5. The method of claim 4, wherein the one-dimensional modulation coding arrangement is Pulse Amplitude Modulation.

6. The method of claim 5, wherein the multiple different data rates correspond to at least one of 16 PAM and 32 PAM.

7. The method of claim 6, wherein one or more additional data rates of the one-dimensional modulation coding arrangement correspond to one or more of the following: 4 PAM and 8 PAM.

8. A multi-rate digital transmission system in which data symbols are transmitted using a convolutional encode channel coding arrangement and a one-dimensional modulation coding arrangement, a set of modulated values having been identified within a framework of the one-dimensional modulation coding arrangement, comprising:
a data-converter for receiving a serial data input signal and responsive to a control signal producing a variable-width parallel data output signal wherein, in at least one mode of operation of the data converter, at least one bit of the variable-width parallel data output signal is zero-filled;
a convolutional encoder responsive to a subset of one or more bits of the variable-width parallel data output signal for producing a number of encoded bits greater than the number of said one or more bits; and
a constellation mapper responsive to a control signal and to data symbols for producing a modulated value, the data symbols including at least a portion of the variable-width parallel data output signal and said encoded bits;
wherein, for one data rate, data symbols are mapped to a complete set of said modulated values, and for another different data rate, data symbols are mapped to a subset of said modulated values.

9. The apparatus of claim 8, wherein the number of modulated values is $2^k$ where $k \geq 2$.

10. The apparatus of claim 9, wherein k=4.

11. The apparatus of claim 9, wherein the digital data transmission system is an xDSL system.

12. The apparatus of claim 9, wherein the one-dimensional modulation coding arrangement is Pulse Amplitude Modulation.

13. The apparatus of claim 12, wherein the multiple different data rates correspond to at least 16 PAM and 32 PAM.

14. The apparatus of claim 13, wherein one or more additional data rates of the one-dimensional modulation coding arrangement correspond to one or more of the following: 4 PAM and 8 PAM.

15. In a digital transmission system in which data symbols are transmitted using a convolutional channel coding arrangement and a modulation coding arrangement, a method of decoding a transmitted data signal, comprising:
identifying within a modulation constellation multiple cosets of constellation points;
mapping received symbols to a smaller constellation by dropping selected symbol bits, whereby, for each of multiple cosets, points within that coset are mapped to a fewer number of points;
generating a reduced number of branch metric values using said smaller constellation; and
performing add-compare-select operations based on said reduced number of branch metric values.

16. The method of claim 15, further comprising:
providing a path table having a distinct row for each state of a convolutional encoder and having multiple columns in accordance with a history depth of the decoder;
storing within the path table binary values representing paths within a trellis corresponding to the convolutional encoder; and
performing a path update operation by, for each of multiple rows of the path table, rewriting the row with values from a different row.

17. The method of claim 16, wherein add-compare-select operations comprise computing a path-weight vector of a dimension comparable to a dimension of a column of the path table, further comprising:
identifying an index value corresponding to a minimum path weight; and
outputting as a decoded bit a value stored within a specified column of the path table at a location corresponding to said index value.

18. The method of claim 17, further comprising updating the path table by dropping said specified column and adding a new column at a different location within the path table, wherein the specified column and the new column are separated by a number of columns substantially equal to the history depth of the decoder.

19. A decoder for decoding data symbols transmitted using a convolutional channel coding arrangement and a modulation coding arrangement, wherein a combination of encoded bits produced by the channel coding arrangement and uncoded bits obtained directly from a data source are modulation encoded, comprising:
a convolutional decoder responsive to a received data symbol for decoding said encoded bits to produce decoded bits; and
a decision block responsive to at least a portion of the received data symbol and to said decoded bits for producing estimates of said uncoded bits;
wherein the decision block has multiple modes and the number of uncoded bits produced is different in different modes.

20. The apparatus of claim 19, wherein the channel coding arrangement and modulation coding arrangement are in accordance with an HDSL2/G.SHDSL standard.

21. The apparatus of claim 20, wherein the number of uncoded bits is greater than two.

22. A encoder for coding data symbols to be transmitted using a convolutional channel coding arrangement and a modulation coding arrangement, wherein a combination of encoded bits produced by the channel coding arrangement and uncoded bits obtained directly from a data source are modulation encoded, comprising:
a convolutional encoder by operating on m data bits to produce n encoded bits where n>m; and
a bits-to-symbol mapper responsive to said encoded bits and to data bits other than said m data bits for producing a data symbol to be transmitted;
wherein the bits-to-symbol mapper has multiple modes, and the number of uncoded bits used by the bits-to-symbol mapper is different in different modes.

23. A decoder for decoding data symbols transmitted using a convolutional channel coding arrangement and a modulation coding arrangement, comprising:
a branch metric generator for mapping received symbols to a smaller constellation by dropping selected symbol bits, whereby, for each of multiple cosets, points within that coset are mapped to a fewer number of points, and for generating a reduced number of branch metric values using said smaller constellation; and
and add-compare-select block for performing add-compare-select operations based on said reduced number of branch metric values.

24. The method of claim 15, further comprising:

a path table having a distinct row for each state of a convolutional encoder and having multiple columns in accordance with a history depth of the decoder, the add-compare-select block storing within the path table binary values representing paths within a trellis corresponding to the convolutional encoder; and a path update block for performing a path update operation by, for each of multiple rows of the path table, rewriting the row with values from a different row.

25. The method of claim 16, wherein:

the add-compare-select block computes a path-weight vector of a dimensional comparable to a dimension of a column of the path table, identifies an index value corresponding to a minimum path weight, and applies the index value to the path update block; and the path update block outputs as a decoded bit a value stored within a specified column of the path table at a location corresponding to said index value.

26. The method of claim 17, wherein the path update block updates the path table by dropping said specified column and adding a new column at a different location within the path table, wherein the specified column and the new column are separated by a number of columns substantially equal to the history depth of the decoder.

* * * * *